United States Patent
Volz et al.

(10) Patent No.: US 7,610,532 B2
(45) Date of Patent: Oct. 27, 2009

(54) SERIALIZER/DE-SERIALIZER BUS CONTROLLER INTERFACE

(75) Inventors: Aaron Matthew Volz, Fort Collins, CO (US); Suzette Denise Vandivier, Fort Collins, CO (US); Jeffrey Andrew Slavick, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 321 days.

(21) Appl. No.: 11/591,158

(22) Filed: Nov. 1, 2006

(65) Prior Publication Data

US 2008/0104462 A1    May 1, 2008

(51) Int. Cl.
*G01R 31/28* (2006.01)
*G11C 29/00* (2006.01)
*G01R 31/26* (2006.01)

(52) U.S. Cl. .................. 714/724; 365/201; 324/765
(58) Field of Classification Search ............... None
See application file for complete search history.

(56) References Cited

U.S. PATENT DOCUMENTS

| | | | | |
|---|---|---|---|---|
| 5,787,114 A | * | 7/1998 | Ramamurthy et al. | 375/221 |
| 6,084,880 A | * | 7/2000 | Bailey et al. | 370/395.2 |
| 6,115,763 A | * | 9/2000 | Douskey et al. | 710/72 |
| 6,526,458 B1 | * | 2/2003 | Steinmetz et al. | 710/1 |
| 7,165,193 B2 | * | 1/2007 | Chen et al. | 714/45 |
| 7,165,196 B1 | | 1/2007 | Porat | |
| 7,343,535 B2 | * | 3/2008 | Lai | 714/724 |
| 2003/0110344 A1 | * | 6/2003 | Szczepanek et al. | 711/100 |
| 2005/0028058 A1 | * | 2/2005 | Perner | 714/718 |
| 2005/0060504 A1 | * | 3/2005 | Chen et al. | 711/154 |
| 2005/0135424 A1 | | 6/2005 | Karaki | |
| 2005/0182588 A1 | | 8/2005 | Chenoweth | |
| 2006/0029038 A1 | * | 2/2006 | Jungck | 370/351 |
| 2007/0013401 A1 | * | 1/2007 | Khandros et al. | 324/765 |
| 2007/0242697 A1 | * | 10/2007 | Caulfield | 370/469 |
| 2007/0255974 A1 | * | 11/2007 | Gilday et al. | 713/503 |

* cited by examiner

Primary Examiner—Kevin L Ellis
Assistant Examiner—Guerrier Merant

(57) ABSTRACT

An application specific integrated circuit (ASIC) uses a dedicated interface between core logic and an independent Serializer/De-serializer bus (SBus) to provide SBus capabilities to the core logic. In addition to the dedicated interface, the ASIC includes a controller responsive to a set of signals and a plurality of receivers distributed about the SBus. Each of the receivers is responsive to a set of commands that can be reused to test logic and support functions across each revision of the ASIC as well as to test separate ASICs with similar arrangements of support functions without requiring the generation of a distinct scan vector to test the ASIC. Additional interfaces, such as an I.E.E.E. 1149.1 interface, further extend SBus capabilities to external test equipment.

20 Claims, 13 Drawing Sheets

SERIALIZER/DE-SERIALIZER BUS CONTROLLER INTERFACE

BACKGROUND

Scan tests are implemented to test circuit behavior, such as behavior caused by manufacturing defects in digital logic based devices. For example, modern microprocessors are implemented using tens of millions of logic gates. Scan tests are used to test the logic gates for faults.

In a conventional scan test, a test pattern is generated to test a prospective device. The test pattern may include a sequence of zeros and ones defined to test various logic gates. An automated test pattern generator (ATPG) is typically used to generate the test pattern. The ATPG analyzes a circuit model (i.e., called a netlist) of a digital logic based device such as a microprocessor (i.e., chip) and identifies a set of potential fault locations or sites on the chip. The ATPG then generates the test patterns necessary to test the device.

Storage elements (i.e., flip-flops) on the device are connected serially during scan test operations into a scan chain or scan chain segment. The test pattern is often generated in a one-to-one relationship with the scan chain segment. For example, if the scan chain is 10 flip-flops long the test pattern may be generated with 10 bits, one bit associated with each flip-flop.

The test pattern is introduced through an input data pin. The test pattern is shifted into the scan chain segment serially, one bit per clock cycle. After a selected number of capture clock cycles, the resulting state of the test is then shifted out through an output pin. As the test pattern is shifted out of the scan chain segment, another test pattern is shifted into the scan chain segment. Each test pattern is generated with the intention of discovering faults in the logic surrounding the flip-flops in the scan chain segment. Therefore, the ATPG generates patterns that will place specific states on the flip-flops in the scan chain so that targeted faults in the surrounding logic can be identified.

Modern integrated circuit architectures include a tremendous amount of logic and gates that need to be tested. Thus, a tremendous amount of data is generated with each test and a substantial number of test patterns have to be generated to test a device. For example, ATPG programs may run for weeks to create test patterns for large, complex circuits.

Since the flip-flops are connected in a serial chain and each bit in the test pattern or vector is shifted into the scan chain at the rate of one bit per clock cycle, when there are tens of millions of bits, it takes a substantial amount of time to shift the test patterns into the scan chain. The cost of performing the scan chain test is directly proportional to the amount of time required to perform the test. As a result, a number of techniques have been developed to optimize the time and lower the cost associated with scan chain testing.

As the complexity of ASICs increases, the number of flip-flops, and thus the associated scan test length, also increases. Further, ASIC architectures may include additional technologies, such as Serializer/De-serializers (SERDES); buffered memory devices; phase-locked loop based timing circuits among others. Additional technologies, such as the SERDES, tend to reduce the number of input/output (I/O) pins available for inputting and outputting the test pattern. These two factors combine to increase the number of clock cycles needed to perform scan tests. As a result of the fewer, longer scan chains, the cost of the scan test increases.

To reduce the test time and cost, a variety of conventional scan compression techniques have been developed. In these scan compression techniques, a test pattern is decompressed on chip after being input, used to perform a scan test, and then the response is compressed on chip before being output. As a result, although limited I/O pins are available, a large variety of test patterns can be generated to test the targeted faults in a limited amount of time. Unfortunately, even the generation of compressed scan test patterns is expensive and time consuming. For example, each time an ASIC design changes (e.g., logic circuits are synthesized or implemented differently than in a previous version), the scan test patterns or test vectors must be regenerated to exercise and confirm desired operation of the ASIC. This is true even when separate ASICs include identical support functions. The problem is further complicated when support functions and application specific logic are to be tested separately. For example, it is sometimes the case that additional technologies or support functions must be tested independently from an ASIC's core logic. Thus, scan chains or test vectors must be generated for each separate test.

Thus, improvements in ASIC testing are required, specifically in the development of systems and methods that enable improved efficiencies in test generation and re-use across disparate synthesized versions of an ASIC and across dissimilar ASICs that share one or more support functions or blocks.

SUMMARY

An application specific integrated circuit (ASIC) and methods for providing Serializer/De-serializer bus (SBus) capabilities to ASIC core logic are illustrated and described. A SBus and strategically located receivers along the SBus provide a standardized interface to support functions coupled to receivers along the SBus. Instead of accessing registers on the ASIC via a scan chain or test vector, the SBus enables access via an address. Each bit in the ASIC scan chain can be associated with a unique address. Consequently, similarly configured support blocks can reuse the same set of commands to verify the block functions nominally.

One embodiment of an ASIC includes a SBus with a controller and a plurality of receivers distributed about the SBus. The SBus is independent of ASIC core logic and other support blocks on the ASIC. The controller includes a core logic interface responsive to a set of signals. The core logic interface exposes SBus capabilities to ASIC core logic. Each of the receivers coupled to the SBus is responsive to a set of commands that can be reused to test logic and support functions on the ASIC. A select set of commands comprising a test can be stored in random access memory in the controller or in the ASIC core logic. A test access port can be used to transfer a select set of commands stored on a remote device to the controller.

Another embodiment describes a method for providing SBus capabilities to ASIC core logic. The method includes the steps of coupling ASIC core logic to a SBus controller via a dedicated multiple-conductor interface, defining a set of signals that when applied via the multiple-conductor interface direct the SBus controller to respond in a predetermined manner and communicating the set of signals to users of the core logic.

A third embodiment describes a method for testing an ASIC. The method includes the steps of receiving a set of commands configured to exercise a function implemented on the ASIC and directing the transfer of select commands from the set of commands using a set of signals that when applied via a multiple-conductor interface direct a SBus controller to respond in a predetermined manner.

Other devices, methods, features and advantages will be or will become apparent to one skilled in the art upon examination of the following figures and detailed description. All such additional devices, methods, features and advantages are defined and protected by the accompanying claims.

BRIEF DESCRIPTION OF THE DRAWINGS

The present ASIC, SBus controller interface, method for providing SBus capabilities to ASIC core logic and method for testing an ASIC, as defined in the claims, can be better understood with reference to the following drawings. The components within the drawings are not necessarily to scale relative to each other; emphasis instead is placed upon clearly illustrating the principles for communicating with the ASIC core using a standard set of commands that can be reused for disparate versions of an ASIC or separate ASICs configured with similar support functions.

DETAILED DESCRIPTION

A Serializer/De-serializer bus (SBus) provides a structure and mechanism for accessing various functions on an integrated circuit. For example, a SBus with appropriately distributed receivers can access a SerDes, a phase-locked loop and other support functions provided on the integrated circuit.

Figure 1:
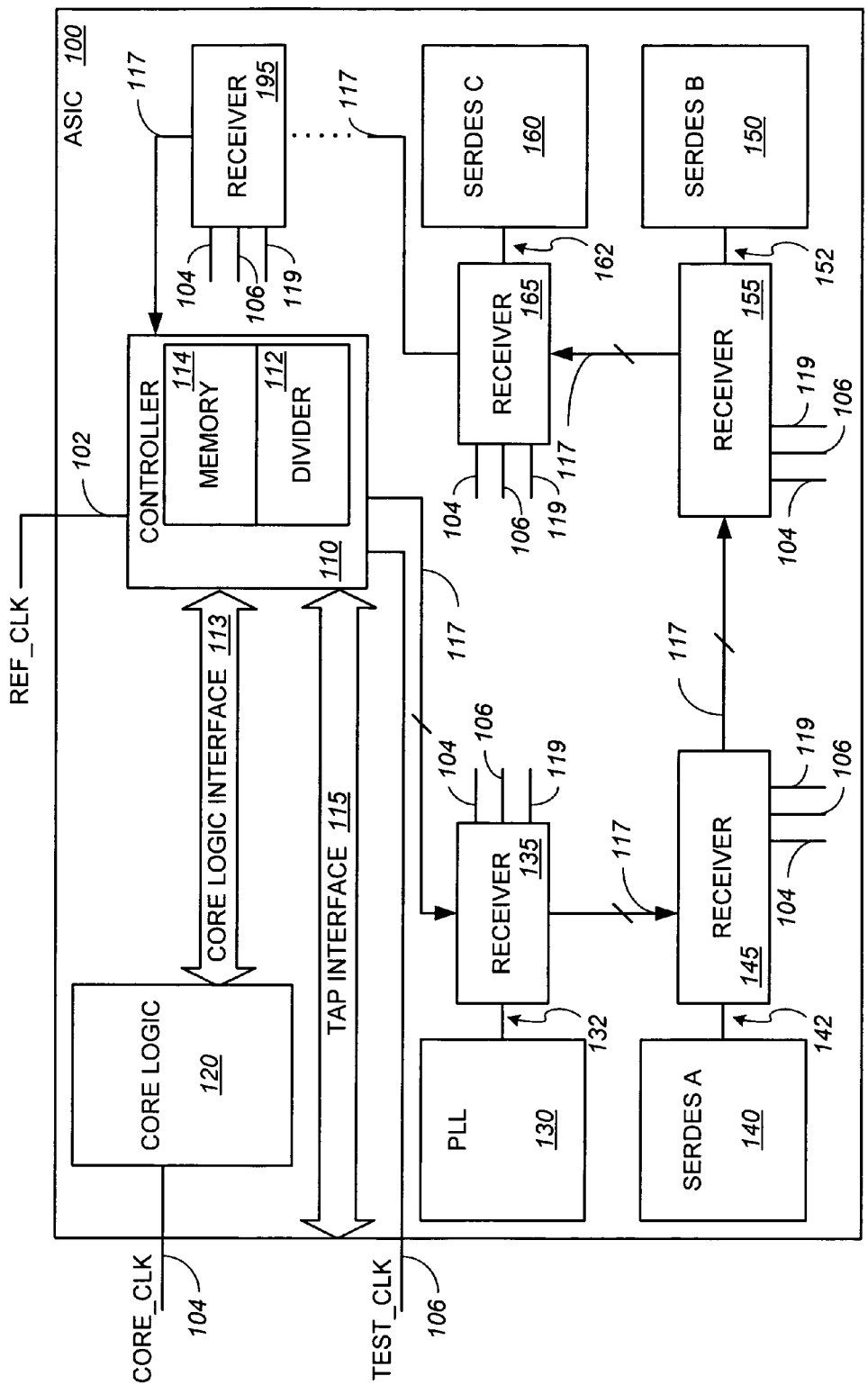
FIG. 1 is a functional block diagram illustrating an embodiment of an application-specific integrated circuit.

FIG. 1 is a functional block diagram illustrating an embodiment of an application-specific integrated circuit (ASIC) 100 configured with a SBus. The SBus consists of controller 110 and a plurality of receivers such as receiver 135, receiver 145, receiver 155, receiver 165, . . . , and receiver 195 coupled to one another and controller 110 in a ring-like manner via bus portions 117. Each of the bus portions 117 consist of multiple conductors for communicating information between various items on ASIC 100 and controller 110. Controller 110 serves as both the start and end of the ring. Controller 110 communicates to each of receiver 135, receiver 145, receiver 155, receiver 165, . . . , and receiver 195 using a signal based protocol. Receiver 135 is coupled to phase-locked loop (PLL) 130 via connection 132. Receiver 145 is coupled to SerDes A 140 via connection 142. Receiver 155 is coupled to SerDes B 150 via connection 152. Receiver 165 is coupled to SerDes C 160 via connection 162. Receiver 195 is available to interface with one or more additional support functions on ASIC 100.

Each of receiver 135, receiver 145, receiver 155, receiver 165 and receiver 195 are configured with a memory.

Information from controller 110 stored in memory 114 can be inserted into appropriate locations within associated support blocks, such as PLL 130 and SerDes A 140 among others by writing to a specified address in the associated receiver and transferring the data at a select time to the associated support block. Similarly, information can be retrieved by controller 110 by transferring data at a select time from a designated support block to a specified address in the associated receiver and forwarding the data in the specified address to the controller 110 along the SBus.

Although each of receiver 135, receiver 145, receiver 155 and receiver 165 are illustrated as separate entities, it should be understood that the receivers can be integrated with one or more support functions or blocks on ASIC 100.

In the illustrated embodiment, controller 110 provides two external interfaces to the SBus. A first interface, designated core logic interface 113, is dedicated to providing SBus capabilities to logical functions implemented in core logic 120 of ASIC 100. A second interface, designated test access port (TAP) interface 115, is dedicated to providing SBus capabilities to external test equipment via input/output pins (not shown). TAP interface 115 is compliant with the Institute of Electrical & Electronics Engineers standard 1149.1 Test Access Port and Boundary Scan Architecture (I.E.E.E. 1149.1). Additional controller interfaces are possible.

In the illustrated embodiment, ASIC 100 receives a reference clock (REF_CLK) signal along connection 102, a core logic interface clock (CORE_CLK) signal along connection 104 and a test interface clock (TEST_CLK) signal along connection 106. In alternative embodiments, one or more of the reference, core logic interface and test interface clocks may be generated on ASIC 100. Regardless, of the locus of their respective generation, core logic interface clock 104 and test interface clock 106 are provided to each of the receivers.

Core logic interface 113 functions in accordance with the core logic interface clock signal. TAP interface 115 functions in accordance with the test interface clock signal. Controller 110, bus portions 117 and each of the receivers function in accordance with the aforementioned clocks and a SBus clock signal provided via connection 119 at specified times.

Controller 110 and bus portions 117 are independent of core logic 120 and support functions such as PLL 130, SerDes A 140, SerDes B 150, etc. SBus requests are initiated by one of the SBus interfaces. SBus requests are received and translated by controller 110 into a SBus packet. After translating the request, controller 110 transmits the packet around the ring and passes request results back to the requesting interface. Each SBus receiver observes the packet, forwards the command along the SBus, executes the command if the command was destined for that particular receiver, and possibly transmits results back to controller 110.

Table 1 below, lists the various signals that together form an SBus interface. Note that the * in the table is a place holder for an indicator or other symbol associated with either core, test, spare or other.

TABLE 1

SBus Interface Signals

| Interface Port Signal | Purpose |
|---|---|
| *__sbus__receiver__address | Address of SBus Receiver |
| *__sbus__data__address | Data Address in the SBus Receiver |
| *__sbus__command | Command Field for Request |

TABLE 1-continued

SBus Interface Signals

| Interface Port Signal | Purpose |
| --- | --- |
| *__sbus__data | Data Field for Request |
| *__sbus__execute | Initiates a SBus Request |
| *__sbus__done | Request Received by Controller |
| *__sbus__rcv__data__valid | Result Code and Result Data Valid |
| *__sbus__result__code | Result Code from SBus Request |
| *__sbus__data__out | Result Data from SBus Requst |

Figure 2:
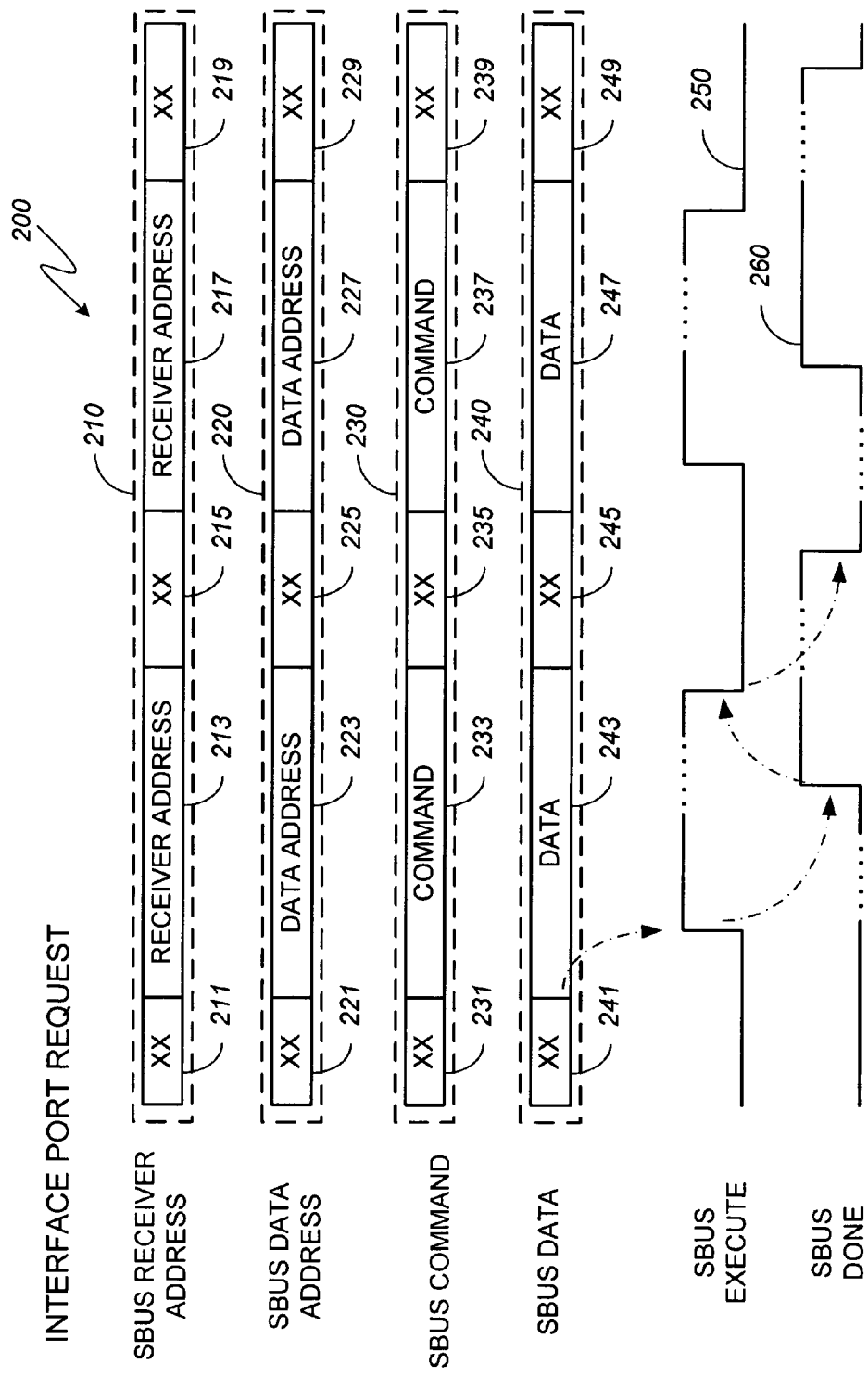
FIG. 2 is a timing diagram illustrating communication of a SBus request that can be applied to the SBus of FIG. 1.

FIG. 2 is a timing diagram 200 illustrating communication of a SBus request that can be applied to the SBus of FIG. 1. A SBus interface port request is initiated by setting the SBus receiver address 210, SBus data address 220, SBus command 230 and SBus data 240 signals. SBus execute signal 250 is transitioned from logic low to logic high only if SBus done signal 260 is low. SBus done signal 260 transitions from logic low to logic high to indicate that the request has been received and is being processed by controller 110. Once SBus execute signal 250 returns to logic low, each of the SBus receiver address 210, SBus data address 220, SBus command 230 and SBus data 240 signals can change values.

For example, as illustrated in FIG. 2, when SBus execute signal 250 is low, each of the SBus receiver address 210, SBus data address 220, SBus command 230 and SBus data 240 signals are represented by do not care portion 211, do not care portion 221, do not care portion 231 and do not care portion 241, respectively. SBus receiver address value 213, SBus data value 223, SBus command 233 and SBus data value 243 are applied before SBus execute transitions. Each of these values are held constant while SBus execute 250 remains high. Once SBus execute 250 transitions from high to low and while SBus done is high, each of the SBus receiver address 210, SBus data address 220, SBus command 230 and SBus data 240 signals are represented by do not care portion 215, do not care portion 225, do not care portion 235 and do not care portion 245, respectively. A subsequent SBus interface port request is communicated the next time SBus execute 250 transitions from low to high. As with the first interface port request, SBus receiver address value 217, SBus data value 227, SBus command 237 and SBus data value 247 are applied before SBus execute transitions. Each of these values are held constant while SBus execute 250 remains high. Once SBus execute 250 transitions from high to low and while SBus done is high, each of the SBus receiver address 210, SBus data address 220, SBus command 230 and SBus data 240 signals are represented by do not care portion 219, do not care portion 229, do not care portion 239 and do not care portion 249, respectively.

Figure 3:
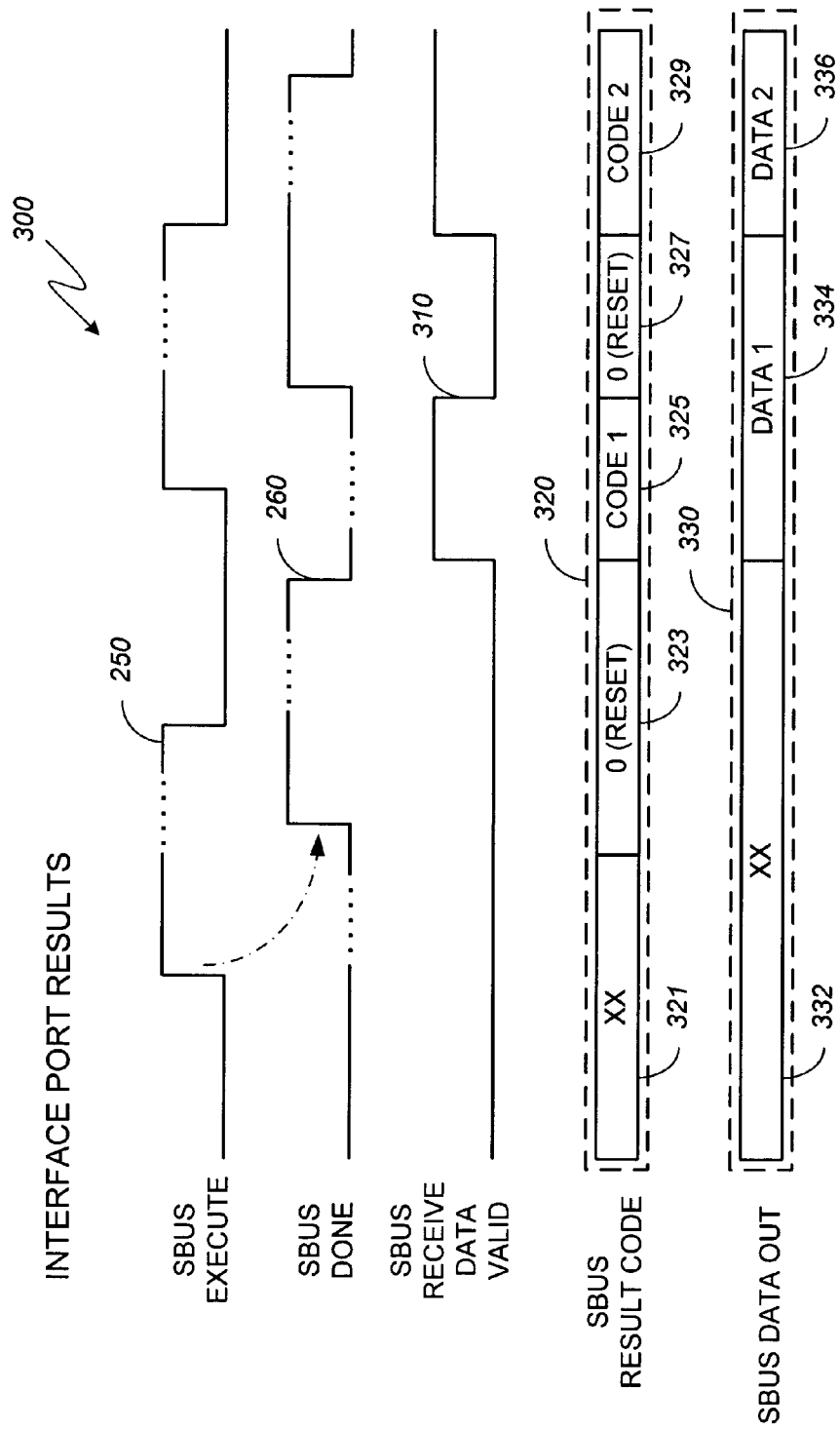
FIG. 3 is a timing diagram illustrating communication of a SBus result that can be observed on the SBus of FIG. 1.

FIG. 3 is a timing diagram 300 illustrating communication of a SBus result that can be observed on the SBus of FIG. 1. Once controller 110 indicates that it has started processing an interface port request (by transitioning the SBus done signal 260 from a logic low to a logic high), the interface may wait for the results and/or continue submitting requests. Controller 110 returns results from requests in the order received. The rising edge of SBus receive data valid signal 310 indicates that a request is complete and the result code and data are valid. Request status is provided by SBus result code signal 320. The SBus result code signal 320 can indicate if the request was completed successfully, or failed. As indicated in FIG. 3, SBus result code signal 320 is represented by a do not care portion 321 before SBus execute transitions from high to low. Controller 110 resets the SBus result code and transitions the SBus done signal 260 from low to high after sensing the SBus execute signal 250 transition from low to high. A first SBus result code 325 corresponds to the rising edge of SBus receive data valid signal 310. A second reset 327 corresponds to the falling edge of SBus receive data valid signal 310. Thereafter, a second SBus result code 329 is presented in coordination with a rising edge of SBus receive data valid signal 310. When a request involves a data read, the data will become available on the SBus data out signal 330 on the rising edge of the SBus receive data valid signal 310. A first do not care portion 332 indicates that data is invalid until SBus done 260 has returned to low and SBus receive data valid has transitioned from low to high. Thereafter, a first data value 334 is presented during the period between first and second rising edge transitions of SBus receive data valid signal 310. A second data value 336 is presented during the period between the second and third rising edge transitions of SBus receive data valid signal 310.

TABLE 2

SBus Result Codes

| Result Code | Definition |
| --- | --- |
| 3'b000 | Reset |
| 3'b001 | Write Valid |
| 3'b011 | Write Error |
| 3'b010 | Read All Complete |
| 3'b100 | Read Valid |
| 3'b110 | Read Error |
| 3'b101 | Mode Change |
| 3'b111 | eBert Done |

Controller 110 recognizes and processes two types of commands, SBus controller commands and SBus receiver commands. SBus controller commands modify the behavior of the SBus interfaces (e.g., core logic interface 113 and TAP interface 115). SBus receiver commands are used to access data within SBus receivers (e.g., receiver 135, receiver 145, receiver 155, etc.). Table 3 defines the fields of the command signal.

TABLE 3

SBus Command Signal

| Bit Field | Definition |
| --- | --- |
| 7 | 1 - SBus Controller Command |
|  | 0 - SBus Receiver Command |
| 6:5 | Interface Destination |
|  | 00 - TAP |
|  | 01 - Core |
|  | 10 - Internal |
| 4:2 | Reserved |
| 1:0 | SBus Controller Commands |
|  | 00 - Read All |
|  | 01 - AND Mode |
|  | 10 - OR Mode |
|  | 11 - Normal Mode (default) |
|  | SBus Receiver Commands |
|  | 00 - Reset |
|  | 01 - Write |
|  | 10 - Read |
|  | 11 - Read Result |

The SBus controller commands provide basic data processing of read data. In response to the Normal Mode command, controller 110 places received data on the data output port. In response to the Read All command, controller 110 starts at the designated SBus receiver address and issues back-to-back requests from that address to a second address.

Data, command and data address remain constant until the read all done result code is received. In response to the OR Mode command, controller 110 performs the OR logic function using the received data and the current state of the output port as inputs. In response to the AND Mode command, controller 110 performs the AND logic function using the received data and the current state of the output ports as inputs. Changing into AND Mode does not reset the data output port. This enables users to place a seed value or mask value onto the data output port prior to initiating AND Mode. This can be accomplished by issuing a read result command to address 0.

The SBus receiver commands are used to access data within the SBus receivers. In response to a Reset command, the addressed SBus receiver resets its memory to default values. In response to the Read command, the addressed SBus receiver asynchronously reads the data from the specified data address. In response to the Write command, the addressed SBus receiver writes the data into its data address. In response to the Read Result command, the addressed SBus receiver sends a read result packet to controller 110. The packet contains the result of the read.

Figure 4:
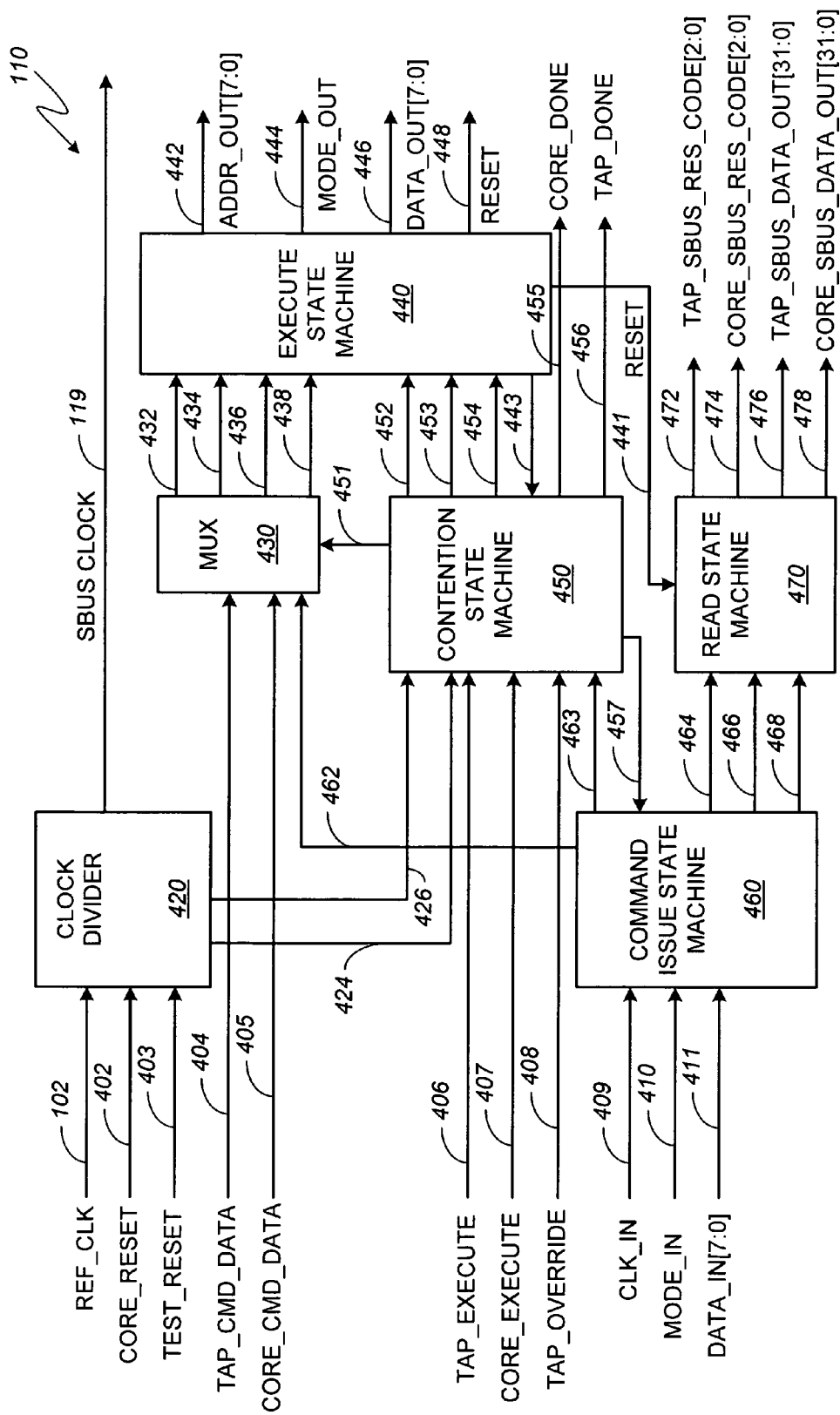
FIG. 4 is a functional block diagram illustrating an embodiment of the controller of FIG. 1.

FIG. 4 is a functional block diagram illustrating an embodiment of the controller 110 of FIG. 1. Controller 110 includes clock divider 420, multiplexer (MUX) 430, execute state machine 440, contention state machine 450, command issue state machine 460 and read state machine 470. Clock divider 420 receives a reference clock signal along connection 102, a core reset signal along connection 402, and a test reset signal along connection 403. In accordance with an input (not shown), clock divider 420 generates and provides a SBus clock signal on connection 119. The SBus clock frequency is a function of the input and the frequency of the reference clock. Clock divider 420 further generates clock test and reset input signals, which are provided along connection 426 and connection 424, respectively to contention state machine 450.

Multiplexer 430 receives a tap command data signal along connection 404 and a core command data signal along connection 405. In addition to these inputs, multiplexer 430 receives power-on self test command data from command issue state machine 460 along connection 462. Multiplexer 430 selects command data from one of the above inputs in accordance with a multiplexer control signal received from contention state machine 450 along connection 451. Multiplexer 430 forwards selected items to execute state machine 440. Specifically, an execute address signal is provided along connection 432. An execute internal address signal is provided along connection 434. An execute command signal is forwarded along connection 436. An execute data command is forwarded along connection 438.

In addition to receiving the clock test and reset input signals from clock divider 420, contention state machine 450 receives a tap execute signal along connection 406, a core execute signal along connection 407 and a tap override signal along connection 408. Contention state machine 450 also receives a power-on self test execute command signal forwarded by command issue state machine 460 along connection 463 and an execute idle signal from execute state machine 440 along connection 443. In response to these received signals, contention state machine 450 forwards the clock test signal along connection 452, the reset input signal along connection 453, an SBus execute signal along connection 454, a core done signal along connection 455, a TAP done signal along connection 456 and a power-on self test done signal via connection 457.

Command issue state machine 460 receives a clock input signal along connection 409, a mode input signal along connection 410, and a data input signal along connection 411. In response to these signals, command issue state machine 460 generates and forwards a clock input signal along connection 464, a mode input signal along connection 466 and a data input signal along connection 468.

Read state machine 470 receives the clock input, mode input and data input signals from command issue state machine 460 via connection 464, connection 466 and connection 468, respectively. In accordance with a state machine reset signal provided along connection 441, read state machine 470 generates a TAP result code signal, which is forwarded along connection 472; a core result code signal, which is forwarded along connection 474; a TAP data output signal, which is forwarded along connection 476 and a core data output signal, which is forwarded along connection 478.

Execute state machine 440 receives the clock test and reset input signals as well as the SBus execute signal from contention state machine 450. Execute State machine 440 also receives the execute address, execute internal address, execute command, and execute data signals from multiplexer 430. In accordance with these signals, execute state machine 440 generates an address output signal, which is forwarded along connection 442; a mode output signal, which is forwarded along connection 444; a data output signal, which is forwarded along connection 446 and a reset output signal, which is forwarded along connection 448.

Controller 110 uses clock divider 420 to create the SBus clock from the reference clock signal. Table 4 lists possible divider ratios. The divider ratio can be set by writing a desired value to a specified address of a specified SBus receiver configured to receive the divider ratio value.

TABLE 4

| SBus Clock Generation | |
|---|---|
| Value | Divider |
| 0 | 1 |
| 1 | 2 |
| 2 | 4 |
| 3 | 8 |
| 4 | 16 |
| 5 | 32 |
| 6 | 64 |
| 7 | 128 (default) |
| 8 | 256 |
| 9 | 512 |
| 10 | 1024 |
| 11 | 2048 |
| 12-16 | 4096 |

Each SBus portion 117 consists of a clock line, eight (8) data lines and a mode indicator line for transmitting packets around the ring. Eight (8) address lines, a rest line and some additional test signals are also included in each SBus portion 117. This set of signals is daisy chained from one functional block to the next across ASIC 100 beginning with the output ports of controller 110 and ending at the input ports of controller 110. The set of signals is listed in Table 5.

TABLE 5

| SBus Signals | |
|---|---|
| Input | Output |
| Clock_in | Clock_out |
| Data_in | Data_out |
| Mode_in | Mode_out |
| Reset_in | Reset_out |

TABLE 5-continued

SBus Signals

| Input | Output |
|---|---|
| Address_in | Address_out |
| Latch_Overrride_in | Latch_Override_out |
| Latch_Override_En_in | Latch_Override_En_out |

The first receiver (e.g., receiver 135) on the SBus is at address one (0001) with each subsequent SBus receiver's address incremented by one. Addresses 0xFF-0xF6, and 0000 are reserved for broadcasting commands and for special purpose receivers. Broadcast addresses allow multiple SBus receivers to respond to a single packet. Table 6 lists an example mapping of broadcast addresses to select functional blocks on ASIC 100.

TABLE 6

SBus Signals

| Address | Support Function |
|---|---|
| 0xFF | SerDes A |
| 0xFE | Controller |
| 0xFD | PLL |
| 0xFC | SerDes B |
| 0xFB | SerDes C |
| 0xFA, 0xF9, 0xF8, 0xF7, 0xF6, 0x00 | Reserved |

Communication across the SBus uses the packet structure shown in Table 7. The mode line is held high for one clock cycle and indicates that the data lines contain the first byte of a packet. Each packet consists of seven (7) bytes of data. Multiple versions of receivers are possible. For example, an eight-bit version transmits/receives one byte of data. A thirty-two bit version transmits/receives four bytes of data.

TABLE 7

SBus Packet Structure

| Byte | Data |
|---|---|
| 1 | Receiver Address |
| 2 | Data Address |
| 3 | Command |
| 4 | Data[7:0] |
| 5 | Data[15:8] |
| 6 | Data[23:16] |
| 7 | Data[31:17] |

Controller 110 input/output (I/O) signals are listed in Table 8. * represents the controller interface (e.g., TAP, core, spare, other).

TABLE 8

Controller I/O Signals

| Signal Name | I/O | Clocked | Sync | Description |
|---|---|---|---|---|
| Ref_clk | I | N/A | N/A | Reference clock |
| Clk_in | I | N/A | N/A | Clock from last SBus RX |
| Reset_in | I | Clk_in | N | Reset from last SBus RX |
| Data_in[7:0] | I | Clk_in | N | Data from last SBus RX |
| Address_in | I | Clk_in | N | Addr from last SBus RX |
| Mode_in | I | Clk_in | N | Mode from last SBus RX |
| *_SBus_address[7:0] | I | Internal | N | SBus address field |
| *_SBus_int_addr[7:0] | I | Internal | N | SBus data address field |
| *_SBus_command[7:0] | I | Internal | N | SBus command field |
| *_SBus_data[31:0] | I | Internal | N | SBus data field |
| *_SBus_execute | I | Internal | Y | Execute signal |
| *_SBus_reset | I | Internal | Y | Reset all SBus blocks |
| TEST_SBus_override | I | Internal | N | Prevents core execution |
| TEST_SBus_tap_res_sel | I | Internal | N | Selects reset signal |
| Clk_out | O | N/A | | Clock to first SBus RX |
| Reset_out | O | Internal | | Reset to first SBus RX |
| Mode_out | O | Internal | | Mode to first SBus RX |
| Data_out[7:0] | O | Internal | | Data to first SBus RX |
| Address_out[7:0] | O | Combo | | Addr to first SBus RX |
| *_SBus_done | O | Internal | | Instruction complete |
| *_SBus_result_code[2:0] | O | Clk_in | | Status of last operation |
| *_SBus_data_out[31:0] | O | Clk_in | | Data of last read |

Figure 5:
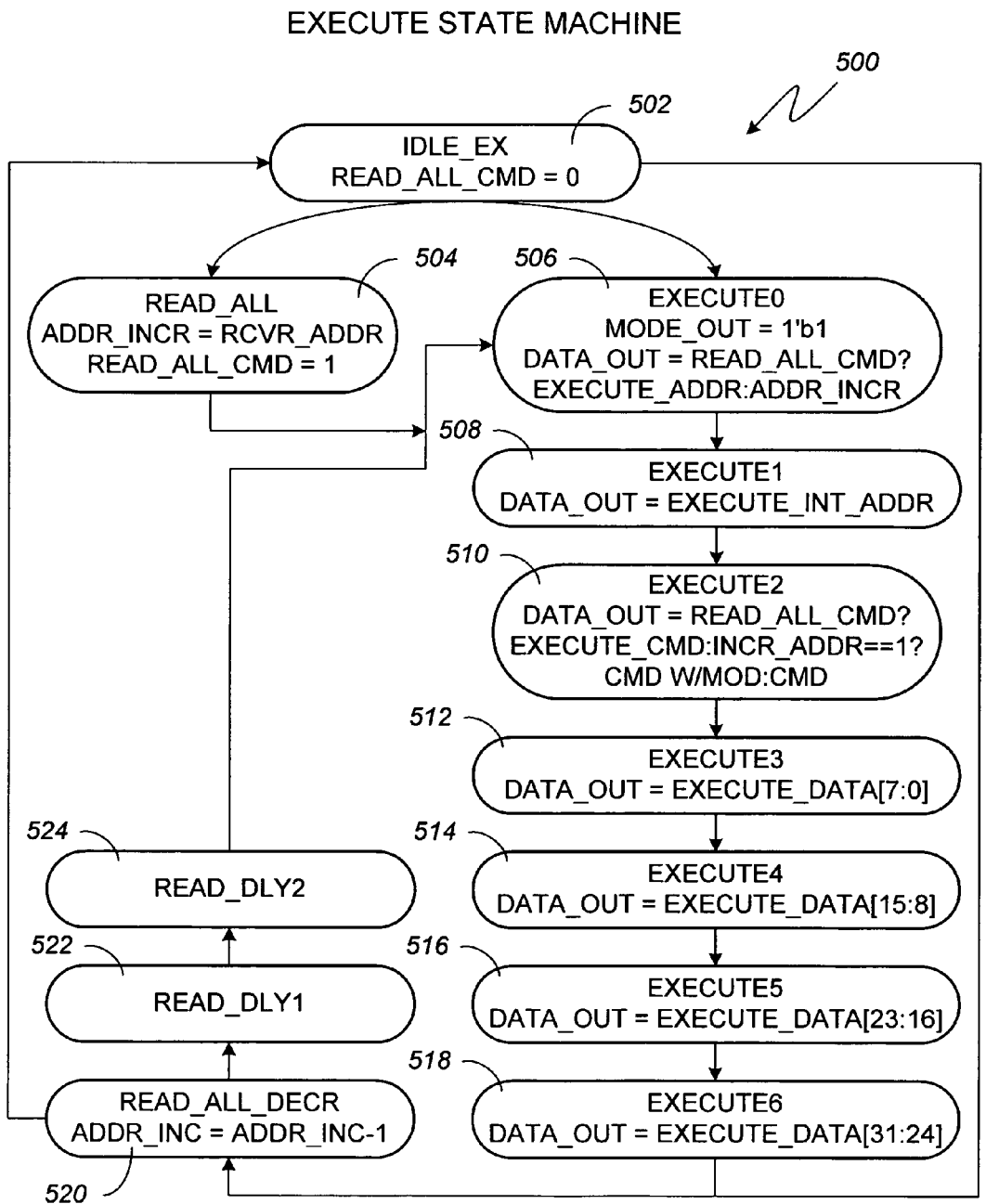
FIG. 5 is flow diagram illustrating operation of the execution state machine of FIG. 4.

FIG. 5 is flow diagram illustrating operation of the execution state machine 440 of FIG. 4. The flow diagram 500 of FIG. 5 shows the architecture, functionality, and operation of a possible implementation of execution state machine 440. In this regard, each block represents a state, which comprises a combination of signal states and data values within controller 110. Execution state machine 440 is a hardware device within controller 110. It should be understood that functions required to implement the various states are representative of a circuit or a number of interconnected circuits configured to implement specified logical function(s).

Execute state machine 440 begins in an idle state 502. When a read all command is detected, the execute state machine 440 transitions to state 504, where a counter is set to the receiver address and an internal flag is set. Otherwise, when a read all command is not detected or when state 504 is complete, the execution state machine 440 transitions to state 506, where a mode output signal and an execute address are configured. Next, the execution state machine transitions to state 508 where a data output signal is configured. In state 510, a determination is made if the command includes a modifier. Thereafter, execution state machine updates the data output signal with data byte 1 in state 512, data byte 2 in state 514, data byte 3 in state 516 and data byte 4 in state 518. After execute state machine 440 has processed the data or when a read all command is not detected, execution state machine 440 transitions to state 520, where a counter is decremented. Thereafter, execution state machine 440 transitions through state 522 and state 524 before returning to state 506 when further execute data is expected. Otherwise, execute state machine 440 transitions to idle state 502.

Figure 6:
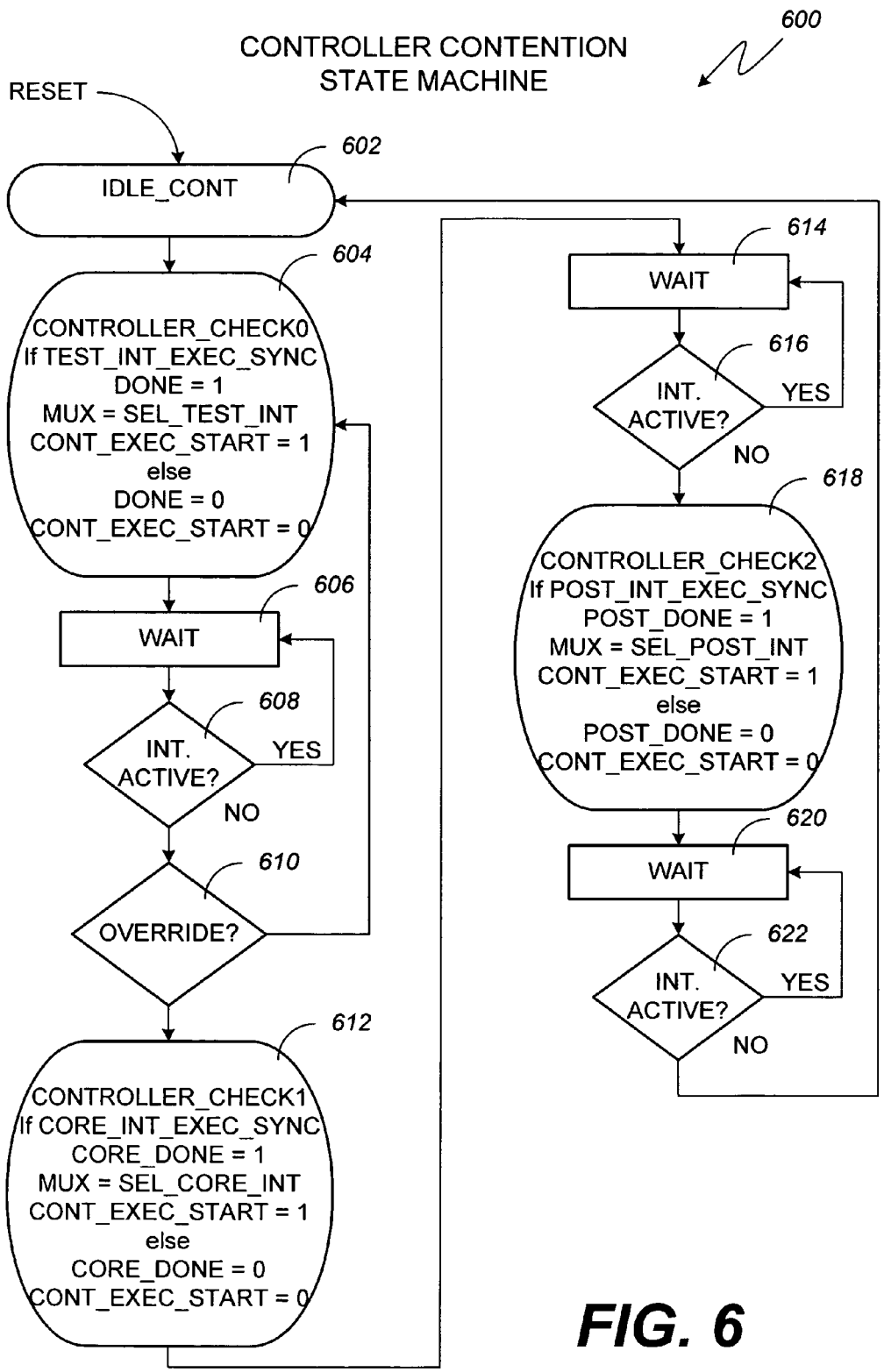
FIG. 6 is a flow diagram illustrating operation of the contention state machine of FIG. 4.

FIG. 6 is a flow diagram illustrating operation of the contention state machine 450 of FIG. 4. The flow diagram 600 of FIG. 6 shows the architecture, functionality, and operation of a possible implementation of contention state machine 450. In this regard, each block represents a state, which comprises a combination of signal states and data values within controller 110. Contention state machine 450 is a hardware device within controller 110. It should be understood that functions required to implement the various states are representative of a circuit or a number of interconnected circuits configured to implement specified logical function(s).

Contention state machine 450 begins with idle state 602, which is responsive to a reset signal. Contention state machine 450 performs a round robin check of available interfaces to determine which interface will be granted controller resources. In state 604, contention state machine 450 observes the present condition of TAP interface 115. In block 606, contention state machine 450 waits for a predetermined time before checking in decision block 608 if the TAP interface 115 is active. When the TAP interface 115 is active, contention state machine 450 transitions to block 606, when the TAP interface 115 is inactive, contention state machine 450 transitions to decision block 610, where a determination is made regarding the status of the test override signal. When the test override signal is set, contention state machine 450 returns to state 604. Otherwise, when the test override signal is not set, contention state machine 450 transitions to state 612. In state 612, contention state machine observes the present condition of core logic interface 113. In block 614, contention state machine 450 waits for a predetermined time before checking in decision block 616 if the core logic interface 113 is active. When core logic interface 113 is active, contention state machine 450 transitions to block 614, otherwise, when core logic interface 113 is inactive, contention state machine transitions to state 618, where contention state machine 450 observes the condition of a power-on self test interface (internal to controller 110). In block 620, contention state machine 450 waits for a predetermined time before checking in decision block 622 if the power-on self test interface is active. When the power-on self test interface is active, contention state machine 450 transitions to block 620, otherwise, when the power-on self test is inactive, contention state machine returns to idle state 602.

Figure 7:
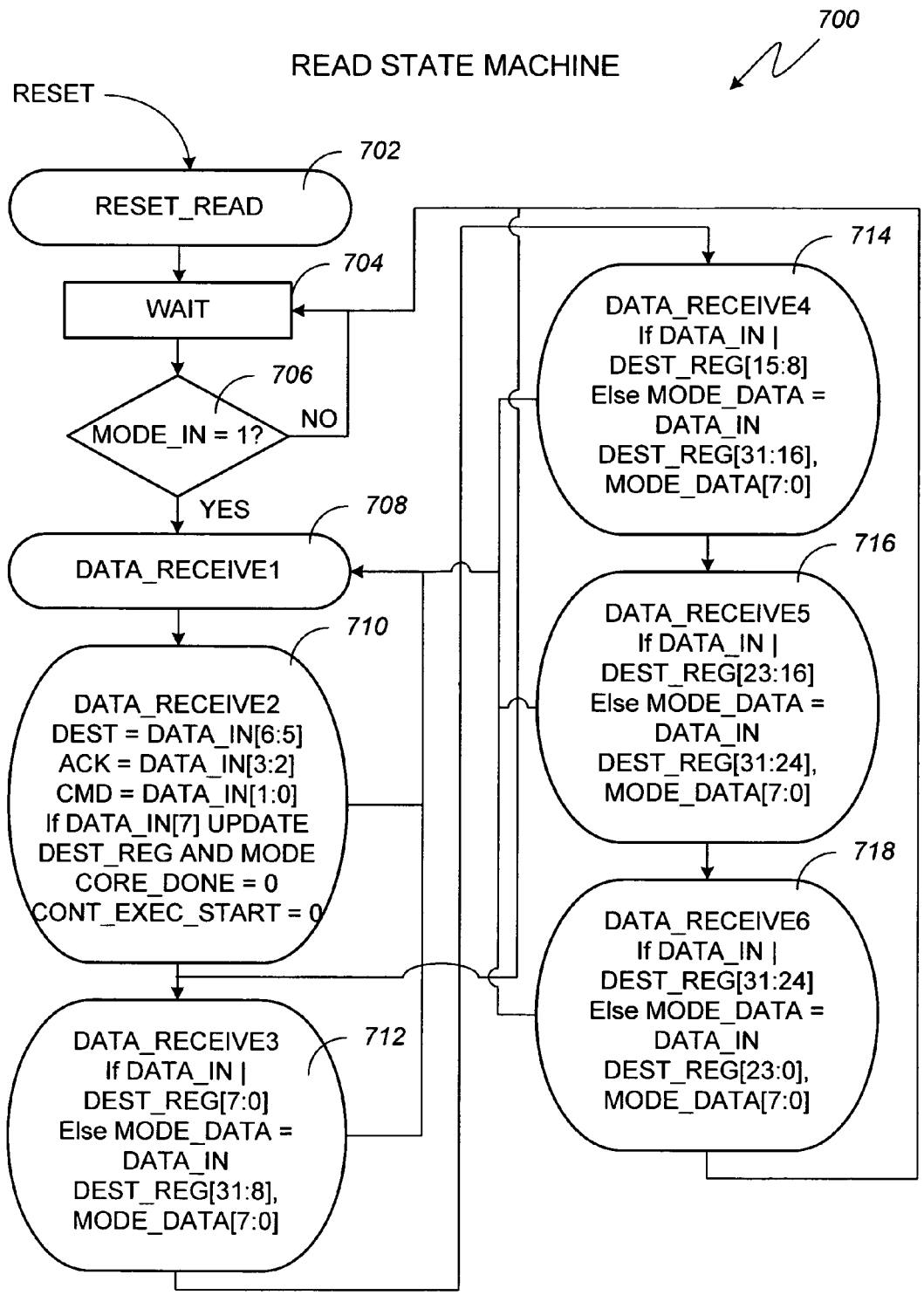
FIG. 7 is a flow diagram illustrating operation of the read state machine of FIG. 4.

FIG. 7 is a flow diagram illustrating operation of the read state machine 470 of FIG. 4. The flow diagram of FIG. 7 shows the architecture, functionality, and operation of a possible implementation of read state machine 470. In this regard, each block represents a state, which comprises a combination of signal states and data values within controller 110. Read state machine 470 is a hardware device within controller 110. It should be understood that functions required to implement the various states are representative of a circuit or a number of interconnected circuits configured to implement specified logical function(s).

Read state machine 470 is responsive to a reset signal that directs the read state machine 470 to state 702 where a set of parameters are initialized. Thereafter, read state machine 470 transitions into an idle mode represented by block 704, decision block 606 and the associated flow control arrows. Once the mode input signal transitions, read state machine 470 transitions to state 708 where a status indicator is configured. Thereafter, read state machine 470 transitions to state 710 where destination, acknowledge, command and mode parameters are configured and a read result command is issued. Thereafter, read state machine 470 transitions to state 712 where received data is applied to the first byte of a destination register, the mode input and a data received status signal are configured. Read state machine 470 then transitions to state 714 where received data is applied to the second byte of the destination register. Thereafter, read state machine 470 transitions to state 716 where received data is applied to the third byte of the destination register. Read state machine 470 then transitions to state 718 where received data is applied to fourth byte of the destination register. Read state machine 470 then returns to the idle state by returning to block 704. States 710 through 718 each generate a receive data valid status signal and a mode input signal that are used to step the read state machine 470 through the received data.

Figure 8:
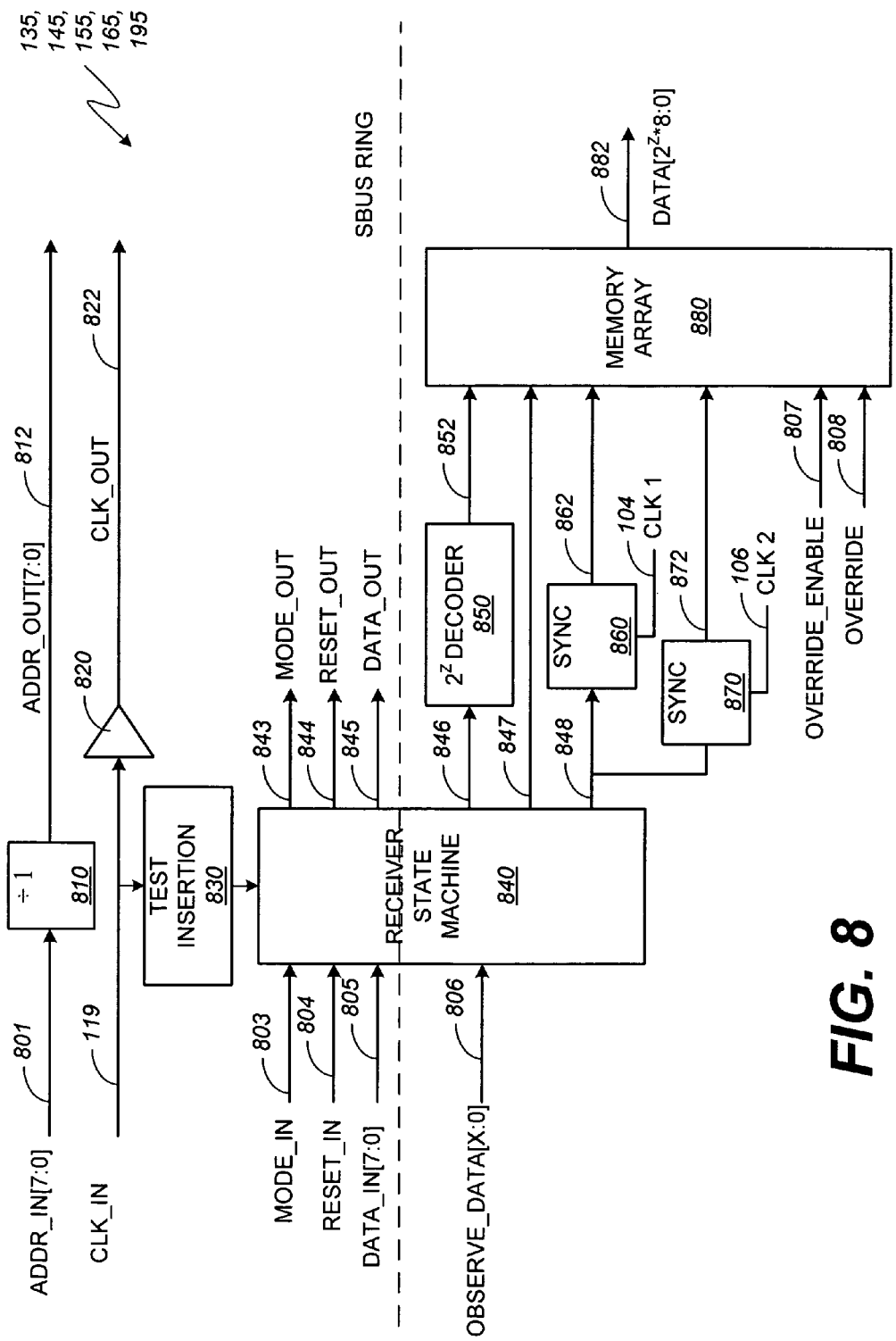
FIG. 8 is a functional block diagram illustrating an embodiment of a SBus receiver of FIG. 1.

FIG. 8 is a functional block diagram illustrating an embodiment of a SBus receiver (e.g., receiver 135, receiver 145, receiver 155, receiver 165, . . . , receiver 195) of FIG. 1. An SBus receiver consists of an input or receive interface and an output or transmit interface. These interfaces are coupled to respective SBus portions 117. An SBus receiver further consists of data control inputs and data observe inputs. The SBus receivers continually monitor data present on the SBus. While in an idle state and where no indications are received specific to that SBus receiver, all data on SBus_data_in is passed to SBus_data_out with a one SBus clock cycle delay.

As illustrated in FIG. 8, an SBus receiver receives multiple SBus ring inputs. An address input signal is received along connection 801 and is applied to delay/buffer element 810. A clock input signal is received along connection 119 and is applied to buffer 820 and test insertion device 830. Buffer 820 generates an amplified version of the clock input signal designated clock_out, which is forwarded along the SBus via connection 822. A mode input signal is received along connection 803 and is applied as a first input to receiver state machine 840. A reset input signal is received along connection 804 and is applied as a second input to receiver state machine 840. A data input signal is received along connection 805 and is applied as a third input to receiver state machine 840. An observe data signal is received along connection 806, which is applied as a fourth input to receiver state machine 840. The output of test insertion device 830 is coupled as a fifth input to receiver state machine 840. In accordance with the first through fifth input signals, receiver state machine 840 generates a plurality of output signals. A mode output signal is generated and applied along connection 843. A reset output signal is generated and applied along connection 844. A data output signal is generated and applied along connection 845.

Additional receiver state machine 840 generated output signals are used to access select memory addresses in memory array 880. For example, an internal address signal is generated and forwarded along connection 846 to decoder 850. Decoder 850 processes the internal address signal to identify a select memory address on a signal, which is applied via connection 852 to memory array 880. A write data signal is generated and applied along connection 847. A write enable signal is generated and applied along connection 848. A first synchronizer circuit 860 receives the write enable signal and clock 1 (i.e., the core logic clock). The first synchronizer circuit 860 generates a first clock strobe signal, which is applied along connection 862 to ensure that data is written into memory array 880 at an appropriate time in accordance with the operation of the SBus clock and the core logic clock signals. A second synchronizer circuit 870 receives the write enable signal and clock 2 (i.e., the test interface clock). The second synchronizer circuit 870 generates a second clock strobe signal, which is applied along connection 872 to ensure that data is written into memory array 880 at an appropriate time in accordance with the SBus clock and test interface clock signals.

Memory array 880, in response to the internal address, write data, first and second clock strobe signals, override input and override enable signals forwards the appropriate data on connection 882 along the SBus.

Figure 9:
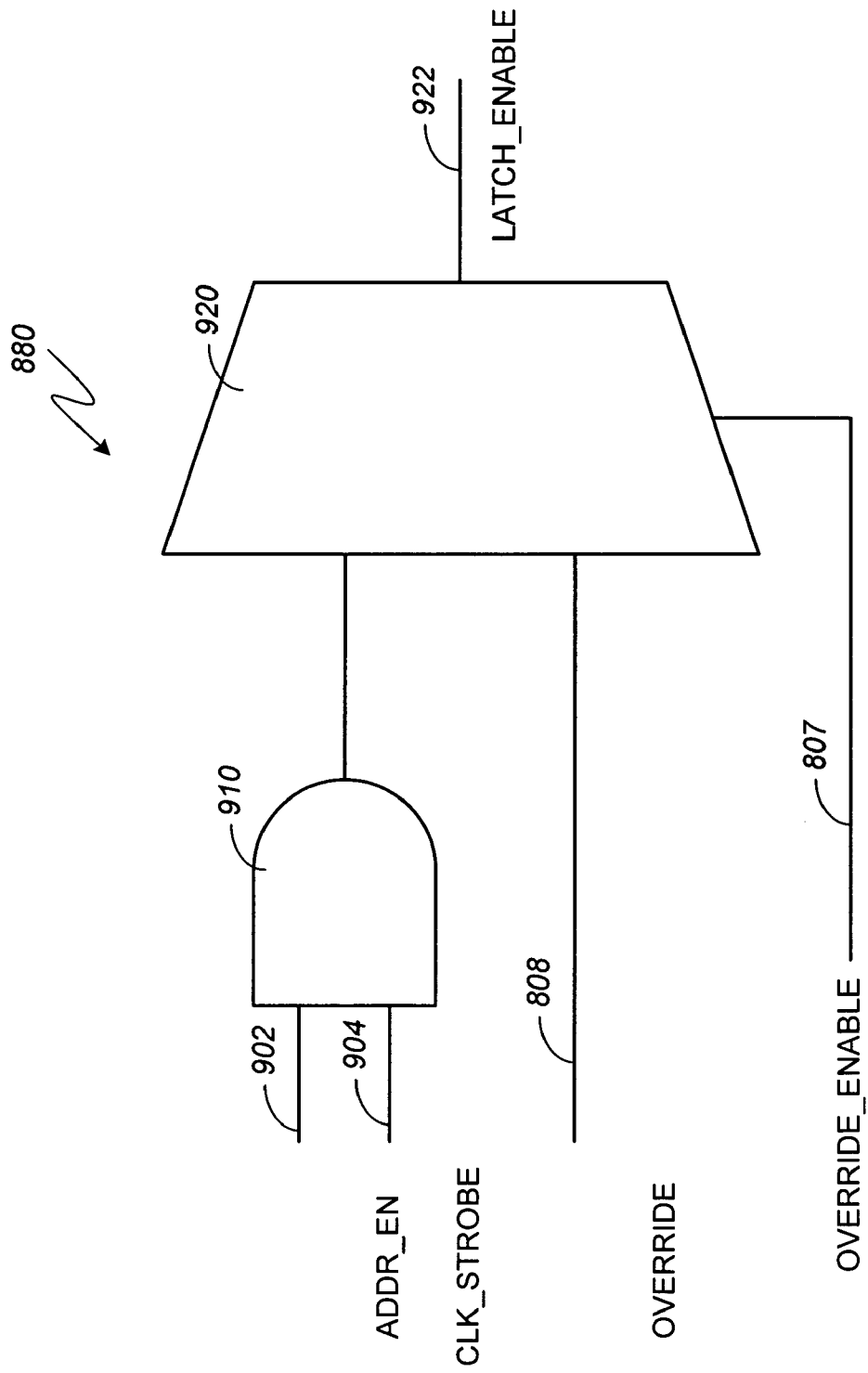
FIG. 9 is a circuit schematic illustrating an embodiment of the latch array of FIG. 8.

FIG. 9 is a circuit schematic illustrating an embodiment of the memory (latch) array 880 of FIG. 8. Memory 880 receives an address enable signal on connection 902, a clock strobe signal on connection 904, an override signal on connection 808 and an override enable signal on connection 807. The address enable signal and clock strobe signal are applied to respective inputs of AND gate 910, the output of which is coupled to a first input of multiplexer 920. The override signal is coupled to the remaining input of multiplexer 920. Multiplexer 920 forwards a latch enable signal on connection 922 that consists of one of the output of AND gate 920 or the override signal in accordance with the override enable signal.

SBus receiver input/output (I/O) signals are listed in Table 9 below.

TABLE 9

SBus Receiver I/O Signals

| Signal Name | I/O | Clocked | Sync | Description |
|---|---|---|---|---|
| Clk_in | I | N/A | N/A | lock from last SBus RX or controller |
| Mode_in | I | Clk_in | N | Mode from last SBus RX or controller |
| Data_in[7:0] | I | Clk_in | N | Data from last SBus RX or controller |
| Address_in[7:0] | I | Combo | N | Address from last SBus RX or controller |
| Reset_in | I | Clk_in | N | Reset from last SBus RX or controller |
| Latch_override_en | I | Combo | N | Enables latch override mode |
| Latch_override | I | Combo | N | Controls latch state when override mode enabled |
| ClkX | I | N/A | N | Clock input for synchronizing data out |
| dX_obs[x:0] (x <= 7) | I | Clk_in | N | Observe data inputs |
| Clk_out | O | N/A | N/A | Clock to next SBus RX or controller |
| Address_out[7:0] | O | Clk_in | | Address to next SBus RX or controller |
| Data_out[7:0] | O | Clk_in | | Data to next SBus RX or controller |
| Mode_out | O | Clk_in | | Mode to next SBus RX or controller |
| Reset_out | O | Clk_in | | Reset to next SBus RX or controller |
| Latch_override_en_out | O | Combo | | Latch override en. to next SBus RX or controller |
| Latch_override_out | O | Combo | | Latch override to next SBus RX or controller |
| dY_cntl[y:0] (y <= 7) | O | ClkX | | Output data synchronized to clockX |

Figure 10:
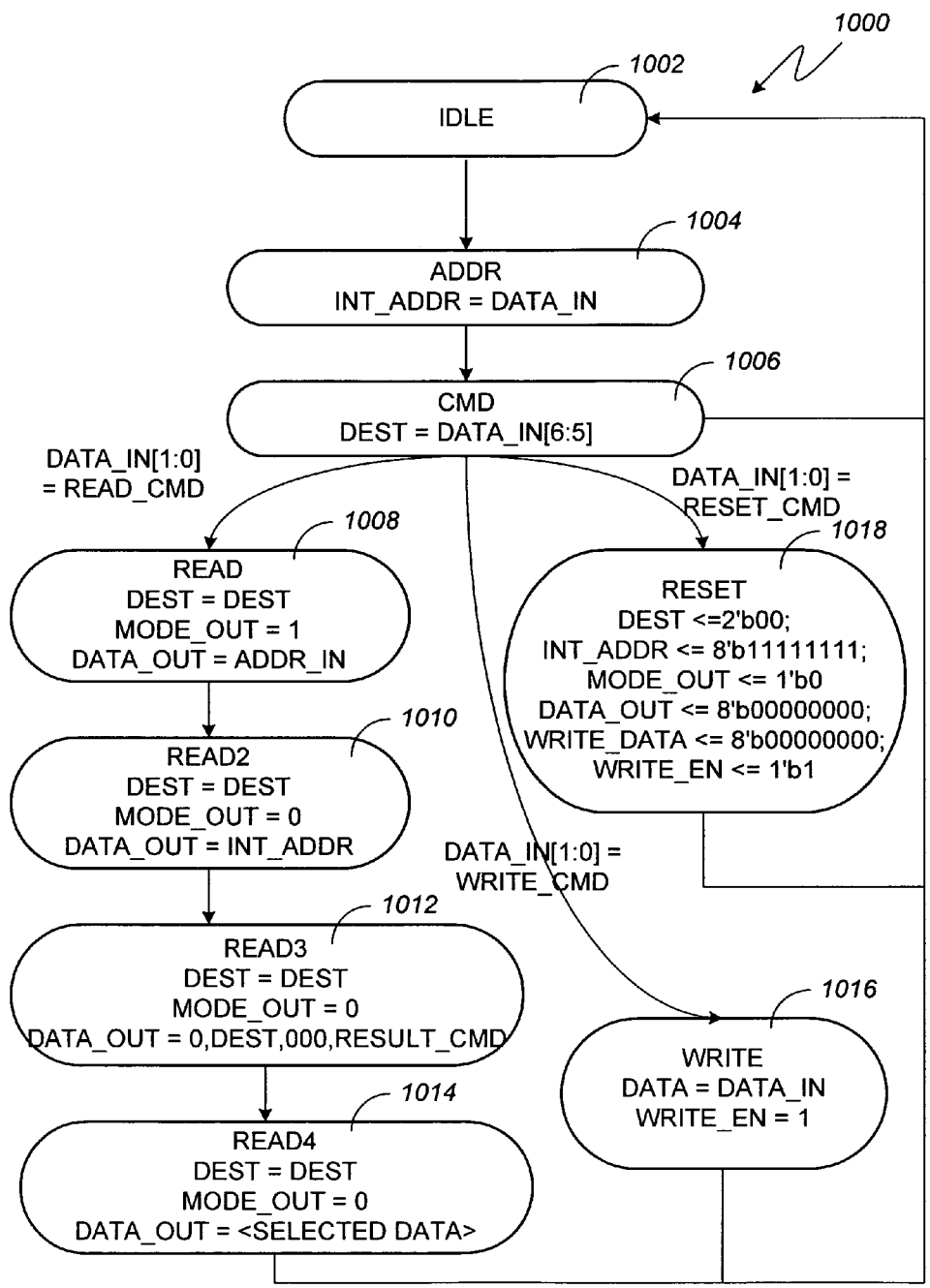
FIG. 10 is a flow diagram illustrating operation of an example SBus receiver of FIG. 1.

FIG. 10 is a flow diagram illustrating operation of an example SBus receiver (e.g., receiver 135, receiver 145, receiver 155, receiver 165, ..., receiver 195) of FIG. 1. The flow diagram of FIG. 10 shows the architecture, functionality, and operation of a possible implementation of an SBus receiver. In this regard, each block represents a state, which comprises a combination of signal states and data values within an SBus receiver. SBus receivers (e.g., receiver 135, receiver 145, receiver 155, receiver 165, ..., receiver 195) are hardware devices on ASIC 100. It should be understood that functions required to implement the various states are representative of a circuit or a number of interconnected circuits configured to implement specified logical function(s).

When a start of a packet indication is received (i.e., when the SBus mode input transitions to logic high), the SBus receiver will process the packet in accordance with the receiver state diagram 1000 in FIG. 10. The SBus receiver is idle in state 1002. When the SBus mode input signal transitions, and an ignore broadcast condition is observed, the SBus receiver transitions to state 1004, where the SBus data input signal is used to set an internal address in the receiver. Thereafter, in state 1006, a destination and command type are determined. When the command type is a read command, processing continues with state 1008. When the command type is a write command, processing continues with state 1016. When the command type is a reset command, processing continues with state 1018.

In state 1008, the SBus address is determined. In state 1010, a receiver memory (i.e., the int_address) is determined. In state 1012, the receiver transfers status information to the data output port of the receiver. In state 1014, the receiver transfers the selected data to the data output port of the receiver. Thereafter, the receiver returns to idle state 1002. Otherwise, when the command type is a write command, the receiver sets a write enable signal and forwards the SBus data to a designated memory location in the receiver as indicated in state 1016 before returning to idle state 1002. When the command type is a reset command, the receiver sets a host of parameters as indicated in state 1018 before returning to idle state 1002.

Figure 11:
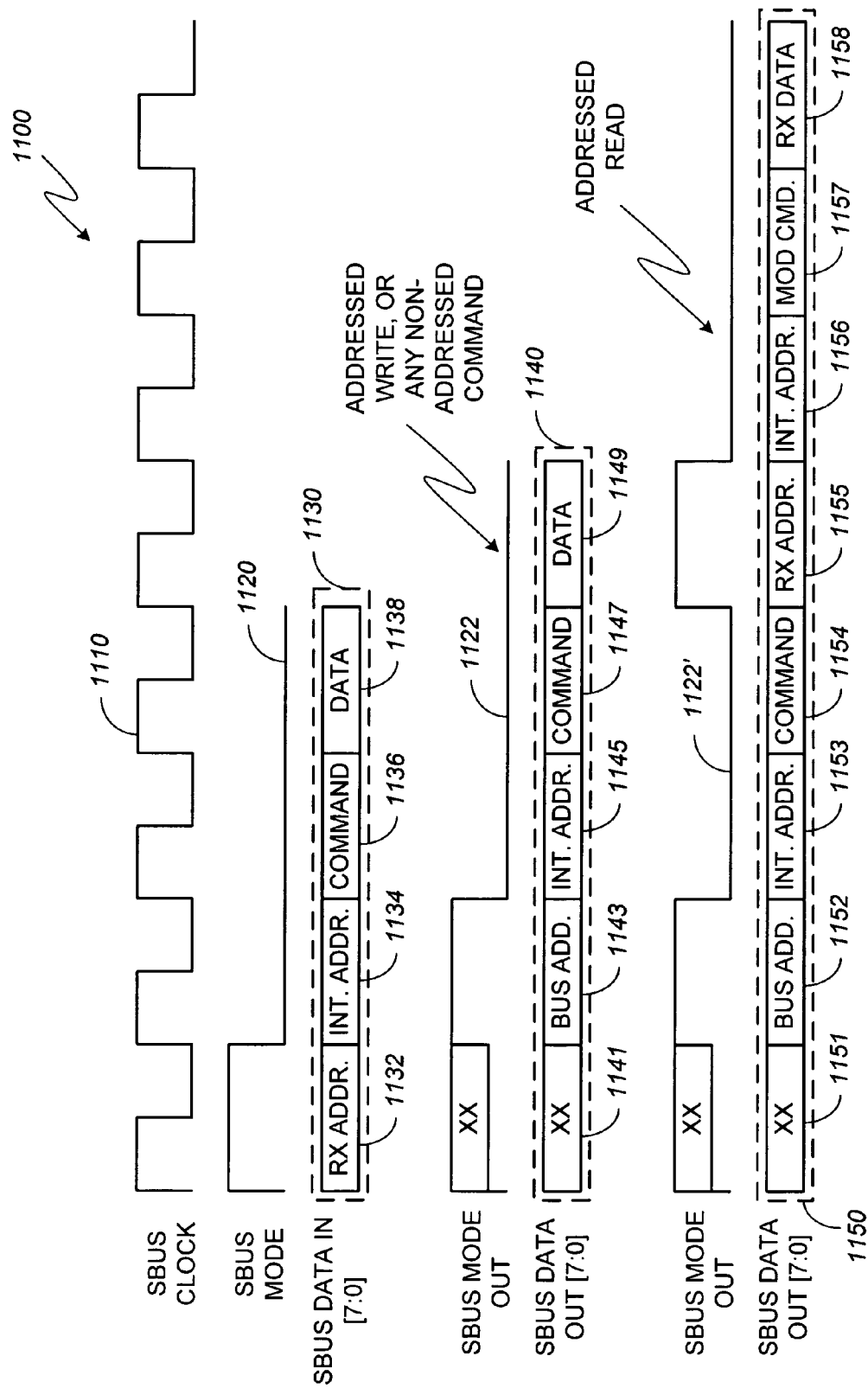
FIG. 11 is a timing diagram illustrating operation of an example SBus receiver of FIG. 1.

FIG. 11 is a timing diagram illustrating operation of an example SBus receiver (e.g., receiver 135, receiver 145, receiver 155, receiver 165, ..., receiver 195) of FIG. 1. SBus clock 1110, SBus mode input 1120 and SBus mode output 1122 signal traces illustrate that these signals control the operation and timing of the receiver. In a first mode or input mode of operation, SBus data input signal 1130 is used to communicate a receiver address 1132, an internal memory address 1134, a command identifier 1136, and data 1138 responsive to the SBus mode input 1120. Receiver address 1132 is communicated in the first byte received on the data input port as SBus mode 1120 transitions to logic high. Thereafter, the internal memory address 1134 is communicated in the second byte on the data input port, the command identifier 1136 is communicated in the third byte and data 1138 is communicated in the fourth byte on the data input port.

In a second or output mode of operation illustrating an addressed write and non-addressed commands, SBus data output signal 1140 is used to communicate a do not care byte 1141, a SBus address 1143, an internal (i.e., memory) address 1145, a command identifier 1147 and data 1149. When SBus mode output signal 1122 transitions to logic high for two clock cycles, the SBus data output port is cleared by the do not care byte 1141 and configured to communicate the SBus address in the second byte. After the SBus mode output signal transitions back to logic low, the SBus data output port transfers internal address 1145, command identifier 1147 and data 1149 in the third, fourth and fifth bytes on the SBus data output port.

In a third mode of operation illustrating an addressed read of information from a receiver memory, SBus data output signal 1150 is used to communicate a do not care byte 1151, a SBus address 1152, an internal (i.e., memory) address 1153, a command identifier 1154, a receiver address 1155, an internal memory address 1156, a modify command identifier 1157 and receiver data 1158. When SBus mode output signal 1122' transitions to logic high for two clock cycles, the SBus data output port is cleared by the do not care byte 1151 and configured to communicate the SBus address in the second byte. After the SBus mode output signal transitions back to logic low, the SBus data output port transfers internal address 1153 and command identifier 1154 in the third and fourth bytes on the SBus data output port. Thereafter, the SBus mode output signal transitions to logic high for a clock cycle, which directs the receiver to communicate receiver address 1155, internal memory address 1156, modify command identifier 1157 and receiver data 1158 in the fifth through eighth bytes on the SBus data output port.

The command issue state machine 460 (FIG. 4) issues two commands with N SBus clock cycles between the commands. The commands follow the same handshaking process that is used to process requests from core logic interface 113 and TAP interface 115. Accordingly, there is some variability in the exact timing when the commands are issued. The command issue state machine 460 is useful when performing a bit-error rate test. During a bit-error rate test, error rate counters are enabled and after a desired period, the error rate counters are disabled. The delay period is configurable by adjusting the SBus clock frequency and communicating a number of clock cycles to wait between issuing the enable/disable commands. Once the two commands have been issued, the configured interface (e.g., the core logic interface 113, the TAP interface 115, etc.) receives a data packet with the result code indicating that the command issue state machine 460 is done.

Figure 12:
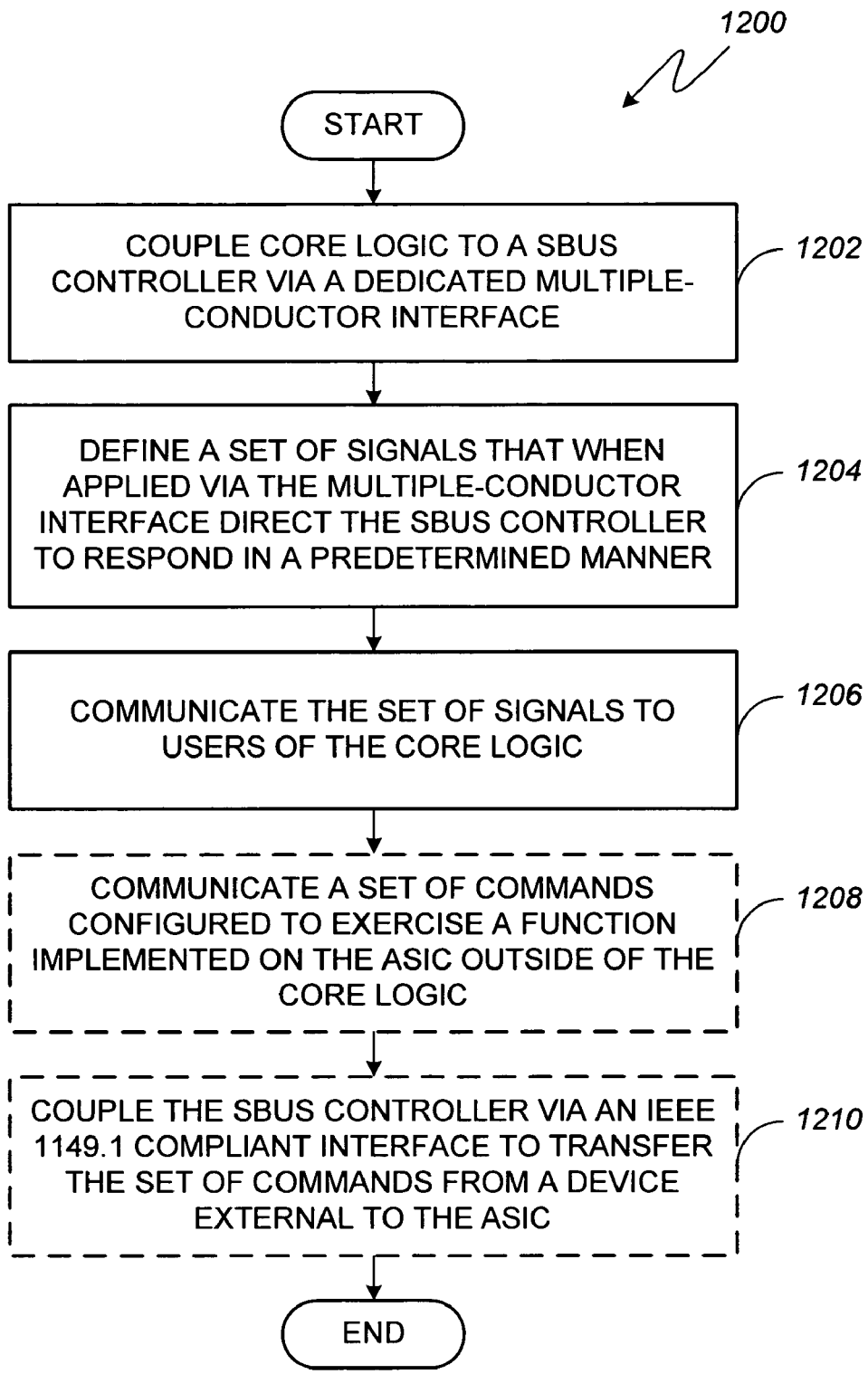
FIG. 12 is a flow diagram illustrating an embodiment of a method for providing SBus capabilities to core logic.

The command issue state machine 460 can also be used to execute a series of pre-programmed commands to test functions on ASIC 100. SBus controller memory addresses can be used to manage and direct operation of controller as listed in Table 10 below.

applied via the multiple-conductor interface, direct the SBus controller to respond in a predetermined manner. Thereafter, as indicated in block 1206, the ASIC test team communicates the set of signals to users of the core logic. The remaining functions illustrated in the flow diagram of FIG. 12 are depicted in blocks with dashed lines to indicate that these functions may further be performed as may be desired. For example, in block 1208, a party interested in testing specified functions supported on the ASIC communicates a set of commands configured to exercise a function implemented in circuits outside of the core logic. By way of further example, in block 1210, a party interested in testing specified functions supported on the ASIC coupled the SBus controller via an I.E.E.E. 1149.1 compliant interface to transfer the set of commands from a device external to the ASIC.

Figure 13:
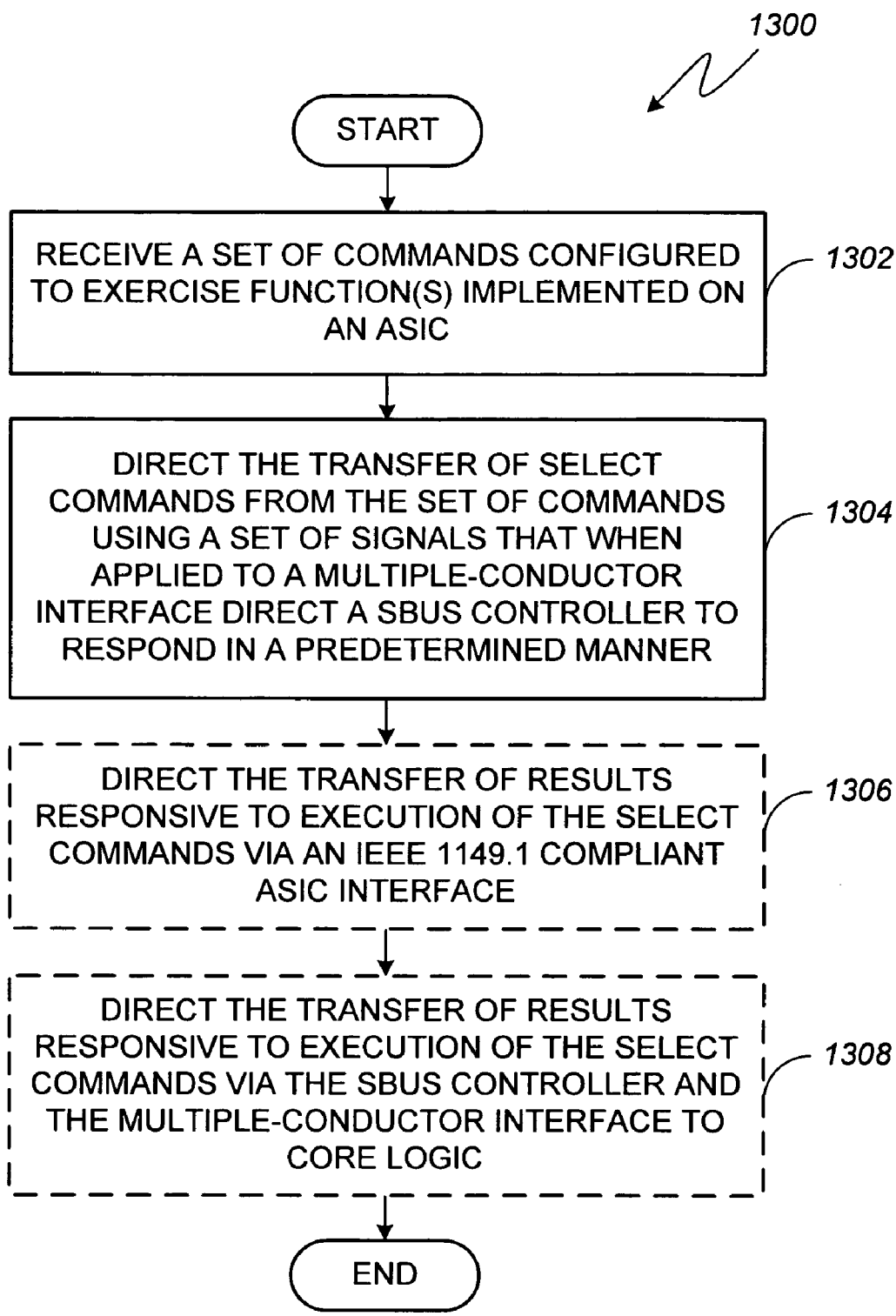
FIG. 13 is a flow diagram illustrating an embodiment of a method for testing an ASIC.

FIG. 13 is a flow diagram illustrating an embodiment of a method 1300 for testing an ASIC. Method 1300 begins with block 1302 where a set of commands configured to exercise function(s) implemented on an ASIC is received. Thereafter,

TABLE 10

SBus Controller I/O Signals

| Address | Name | Bit | Description | Default |
|---|---|---|---|---|
| 0x00 | CISM start | 0 | Start command issue state machine | 0 |
| 0x01 | Timer value | 4:0 | Number of SBus clock cycles to wait | 0x14 |
| 0x02 | Last SBus address | 7:0 | Value of SBus address input connected to controller | X |
| 0x03 | Interface mask | 2 | Disable spare interface | 0 |
| 0x03 | Interface mask | 1 | Disable test interface | 0 |
| 0x03 | Interface mask | 0 | Disable core interface | 0 |
| 0x0A | Clock divider | 7 | Enable non-$2^N$ divide by values | 0 |
| 0x0A | Clock divider | 3:0 | Divider value | 0x07 |
| 0x0B | Clock divider reset value | 11:0 | Value sent to counter when bit 7 of 0x0A is set | 0xFFF |
| 0x0C | Clock divider reset value page 1 | 7:0 | Access to bits 7:0 of address 0x0B | 0xFF |
| 0x0D | Clock divider reset value page 2 | 3:0 | Access to bits 11:8 of address 0x0B | 0xF |
| 0x10 | CISM RX Address | 7:0 | SBus RX address used by CISM | 0xFF |
| 0x11 | CISM command 0 | 7:0 | Command field for first command issued by CISM | 0x01 |
| 0x12 | CISM data address 0 | 7:0 | Data address for first command issued by CISM | 0x04 |
| 0x13 | CISM data 0 | 31:0 | Data field for first command issued by CISM | 0x87 |
| 0x14 | CISM command 1 | 7:0 | Command field for second command issued by CISM | 0x01 |
| 0x15 | CISM data address 1 | 7:0 | Data address for second command issued by CISM | 0x04 |
| 0x16 | CISM data 1 | 31:0 | Data field for first command issued by CISM | 0x87 |
| 0x80 | Generic IO 0 | 31:0 | Miscellaneous IO | 0x0 |
| 0x81 | Generic IO 1 | 31:0 | Read only miscellaneous IO | X |
| 0x82 | Generic IO page 1 | 7:0 | IO bits 7:0 | 0x0 |
| 0x83 | Generic IO page 2 | 7:0 | IO bits 15:8 | 0x0 |
| 0x84 | Generic IO page 3 | 7:0 | IO bits 23:16 | 0x0 |
| 0x85 | Generic IO page 4 | 7:0 | IO bits 31:24 | 0x0 |
| 0x86 | Generic IO page 1 | 7:0 | IO bits 7:0 | X |
| 0x87 | Generic IO page 2 | 7:0 | IO bits 15:8 | X |
| 0x88 | Generic IO page 3 | 7:0 | IO bits 23:16 | X |
| 0x89 | Generic IO page 4 | 7:0 | IO bits 31:24 | X |
| 0xFE | IDCODE | 7:0 | SBus controller identifier | 0xBB |

FIG. 12 is a flow diagram illustrating an embodiment of a method 1200 for providing SBus capabilities to core logic. Method 1200 begins with block 1202 where an ASIC design team couples core logic to a SBus controller using a dedicated multiple-conductor interface. Substantially concurrently therewith, an ASIC test team defines a set of signals that when as indicated in block 1304, a party interested in testing specified functions supported on the ASIC directs the transfer of select commands using a set a signals that when applied via a multiple-conductor interface, direct a SBus controller to respond in a predetermined manner to initialize and extract information from the ASIC. The remaining functions illustrated in the flow diagram of FIG. 13 are depicted in blocks with dashed lines to indicate that one or the other may be directed. For example, in block 1306, a party interested in testing specified functions supported on the ASIC directs the transfer of results responsive to execution of the select commands using an I.E.E.E. 1149.1 compliant interface. By way of further example, in block 1308, a party interested in testing specified functions supported on the ASIC directs the transfer of results via the controller and the multiple-conductor interface to communicate with core logic on the ASIC.

It should be noted that various commands or sets of commands that can be processed by controller 110 and receivers along the SBus can be stored on any computer-readable medium for use by or in connection with any computer related system or method. In the context of this document, a "computer-readable medium" can be any means that can store, communicate, propagate, or transport the program for use by or in connection with a test instruction execution system, apparatus, or device. The computer-readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a RAM (electronic), a ROM (electronic), an erasable programmable read-only memory (EPROM), an electrically erasable programmable read-only memory (EEPROM), or Flash memory) (electronic), an optical fiber (optical), and a CDROM (optical). Note that the computer-readable medium could even be paper or another suitable medium upon which the program is printed, as the program can be electronically captured, via for instance, optical scanning of the paper or other medium, then compiled, interpreted or otherwise processed in a suitable manner if necessary, and then stored in a computer memory.

The foregoing description has been presented for purposes of illustration and description. It is not intended to be exhaustive or to limit the scope of the claims to the precise forms disclosed. Modifications or variations are possible in light of the above teachings. The embodiments discussed, however, were chosen and described to enable one of ordinary skill to utilize various embodiments of the present ASIC, SBus controller interface, method for providing SBus capabilities to ASIC core logic and method for testing an ASIC. All such modifications and variations are within the scope of the appended claims when interpreted in accordance with the breadth to which they are fairly and legally entitled.

What is claimed is:

1. An application-specific integrated circuit (ASIC), comprising:
    a Serializer/De-serializer bus (SBus) independent of core logic and support blocks on the ASIC, the SBus comprising:
        a controller configured with a SBus interface, a core logic interface a test access port interface, and a contention state machine configured to identify which of the core logic interface or the test access port interface will be granted controller resources, the core logic interface responsive to a set of signals and providing SBus capabilities to logical functions implemented in core logic of the ASIC, the controller and the core logic interface being asynchronous to each other; and
        a plurality of receivers distributed about the SBus.

2. The ASIC of claim 1, wherein the controller further comprises a test interface, the test interface asynchronous to the core logic interface and the controller.

3. The ASIC of claim 1, wherein the set of signals communicates a receiver address, a data address, a command, data, and an execute request.

4. The ASIC of claim 3, wherein the command is directed to one of a receiver and a controller interface.

5. The ASIC of claim 1, wherein the set of signals further communicates a handshake, a result code, and result data.

6. The ASIC of claim 5, wherein the set of signals further communicates an indicator that the result code and result data are valid.

7. The ASIC of claim 1, wherein the controller comprises a programmable divider to configure a SBus clock.

8. The ASIC of claim 1, wherein the controller communicates a multiple byte packet responsive to a SBus mode signal.

9. The ASIC of claim 1, wherein the controller comprises a command issue state machine configured to issue consecutive SBus commands with a predictable interval between the consecutive SBus commands.

10. The ASIC of claim 9, wherein end user access comprises a set of commands suited for re-use.

11. The ASIC of claim 1, wherein each of the plurality of receivers is configured with logic responsive to a plurality of clocks, the plurality of clocks having a distinct period from the remaining clocks.

12. The ASIC of claim 1, wherein each of the plurality of receivers is configured with test logic.

13. A method for providing Serializer/De-serializer bus (SBus) capabilities to core logic within an application specific integrated circuit (ASIC), comprising:
    coupling core logic to a SBus controller via a dedicated multiple-conductor interface, the SBus controller having core logic, test access port and SBus interfaces, the core logic interface providing SBus capability to logical functions implemented in core logic of the ASIC;
    defining a set of signals that when applied via the multiple-conductor interface, direct the SBus controller to respond in a predetermined manner, the SBus controller using a contention state machine to identify which of the core logic interface or the test access port interface will be granted SBus controller resources; and
    communicating the set of signals to users of the core logic.

14. The method of claim 13, further comprising:
    communicating a set of commands configured to exercise a function implemented on the ASIC outside of the core logic.

15. The method of claim 14, further comprising:
    coupling the SBus controller via an I.E.E.E. Standard Test Access Port and Boundary Scan Architecture 1149.1-1990 compliant interface to enable the transfer of the set of commands from a device external to the ASIC.

16. A method for testing an application specific integrated circuit (ASIC), comprising:
    receiving a set of commands configured to exercise a function implemented on the ASIC; and
    directing the transfer of select commands from the set of commands using a set of signals that when applied via a multiple-conductor interface, direct a SBus controller to respond in a predetermined manner, the SBus controller having a core logic interface, a test access port interface and a SBus interface, the core logic interface providing SBus capability to logical functions implemented in core logic of the ASIC and using a contention state machine to identify which of the core logic interface or the test access port interface will be granted SBus controller resources.

17. The method of claim 16, further comprising:
directing the transfer of results from the execution of the select commands via an I.E.E.E. Standard Test Access Port and Boundary Scan Architecture 1149.1-1990 compliant ASIC interface.

18. The method of claim 16, wherein directing the transfer of select commands comprises reading a random access memory located within a region of the ASIC dedicated to core logic.

19. The method of claim 16, wherein directing the transfer of select commands comprises reading a computer-readable memory external to the ASIC.

20. The method of claim 16, further comprising:
directing the transfer of results from the execution of the select commands via the SBus controller and the multiple-conductor interface to ASIC core logic.

* * * * *